DEVICE FOR THERMAL PROCESSING OF SEMICONDUCTOR WAFERS

Filed April 4, 1968

United States Patent Office 3,536,892

Patented Oct. 27, 1970

3,536,892

DEVICE FOR THERMAL PROCESSING OF SEMICONDUCTOR WAFERS

Albert Walther, Gartenberg, and Erhard Sussmann, Poing, Germany, assignors to Siemens Aktiengesellschaft, Berlin and Munich, Germany, a corporation of Germany

Filed Apr. 4, 1968, Ser. No. 718,880
Claims priority, application Germany, Apr. 7, 1967, S 109,233
Int. Cl. F27d *11/02*
U.S. Cl. 219—439 4 Claims

ABSTRACT OF THE DISCLOSURE

A device for thermal processing of disc shaped objects for semiconductor purposes, wherein the discs to be treated are arranged on the bottom of a treatment chamber and are heated from below to appropriate processing temperature by a heating device with an areal extension and with its upper surface parallel to the discs being treated. The heating device is held only by its current supply electrodes and is provided with means which reduce or compensate the heat losses caused by dissipation, via said current electrodes.

Epitaxy is frequently used for producing semiconductor components. This technique consists in heating discs or wafers of semiconductor crystals, particularly monocrystals, to a high temperature below the melting point of the semiconductor, while simultaneously passing a reaction gas across the discs. Semiconductor material, usually monocrystalline, thus precipitates upon the semiconductor discs. The semiconductor discs are heated mainly by electrical means, for example by maintaining the wafers, during the precipitation process, in direct contact with a carrier and heater consisting of heat resisting, conducting material through which passes an electrical heating current. Alternatively, the wafers may contact an insulating intermediate layer which in turn contacts the carrier. Of course, other heating possibilities also exist. For many known reasons, the preferred reaction gas is a halogen or a halogen hydride of the element to be produced. This active component is preferably diluted with hydrogen, and possibly with an inert gas. Frequently, specific concentrations of dopants are also added.

The production of semiconductor components by epitaxy requires a high uniformity of the precipitated layers as to thickness and doping. One of the prerequisites necessary to achieve this requirement is an exceptionally uniform heating of the semiconductor discs being processed. This problem was considered in patent application Ser. No. 718,881 filed on even date herewith. According to this copending application, the uniform heating is effected in a device for thermal processing of discs for semiconductor purposes, wherein the discs to be processed are arranged at the bottom of a processing chamber and are heated to the proper processing temperature by a heating device located beneath the bottom of the chamber and extending areally with its upper surface parallel to the discs to be processed. A temperature adjusting device, i.e. a temperature adjustment plate, is arranged between the heating device and the bottom of the treatment vessel and extends, at least in its center portion, parallel to the bottom of the treatment vessel. This plate is so constructed that the axial heat flow, traversing the center portion of the temperature adjusting device, i.e. in the direction from the heating device toward the discs to be processed, encounters a stronger impedance in said center of the parallel portion of temperature adjusting device than at the edge, while the radial flow of heat in the temperature adjusting device, i.e. flowing from the inside outward, meets with an impedance at least in some places.

The aforementioned measures balance temperature irregularities which may be caused by an understructure of the heater, directly at the locality of the semiconductor discs to be treated. Furthermore, the effect of the edge drop of the temperature, occurring in the heater as a consequence of the stronger heat dissipation, occurring at the edge, upon the semiconductor discs to be treated is balanced.

Our invention is based upon the recognition of another important cause for temperature irregularities at the locality of the discs to be processed. It is an object of our present invention to remove said irregularities.

The present invention relates to a device for thermal processing of disc shaped bodies for semiconductor purposes, wherein the discs to be processed are arranged at the bottom of a treatment chamber and are heated to appropriate processing temperatures by means of a heating device, located beneath said bottom, and areally extended with its upper surface parallel to the discs to be processed. The device is characterized, in accordance with our present invention, by the fact that the heater comprising particularly an elongated conductor, twisted in spiral or meander shape, is held only by its current supply electrodes and is provided with means which reduce or compensate for the heat losses, dissipated by the current supply electrodes.

Three possibilities exist for such compensation:

(1) Dimensioning the current supply electrodes so that the Joule heat produced therein compensates the losses caused by heat dissipation.

(2) Utilizing a portion of the heat energy, which is radiated by the heating device but not used for heating the semiconductor discs, to compensate for the heat losses, effected by the electrodes; for example, by at least partially supplying the heat radiated at the bottom surface of the heating device, by reflection to the connecting points of the current supply electrodes.

(3) Arranging auxiliary heat sources in the vicinity of the connecting locations of the current supply electrodes, to counteract the aforementioned heat losses.

It is of utmost importance that the heat losses, which require a local cooling of the heater, are compensated as far as possible with the aid of the above-mentioned measures. They should, however, not be overcompensated to the point where the temperature increases caused by said measures, are so overbalanced that the temperature irregularities to be compensated merely change their plus and minus signs, without really effecting, thereby, a reduction in the temperature variations.

In the drawing, FIG. 1 shows apparatus for carrying out the invention;

Figures 1, 2, 3:
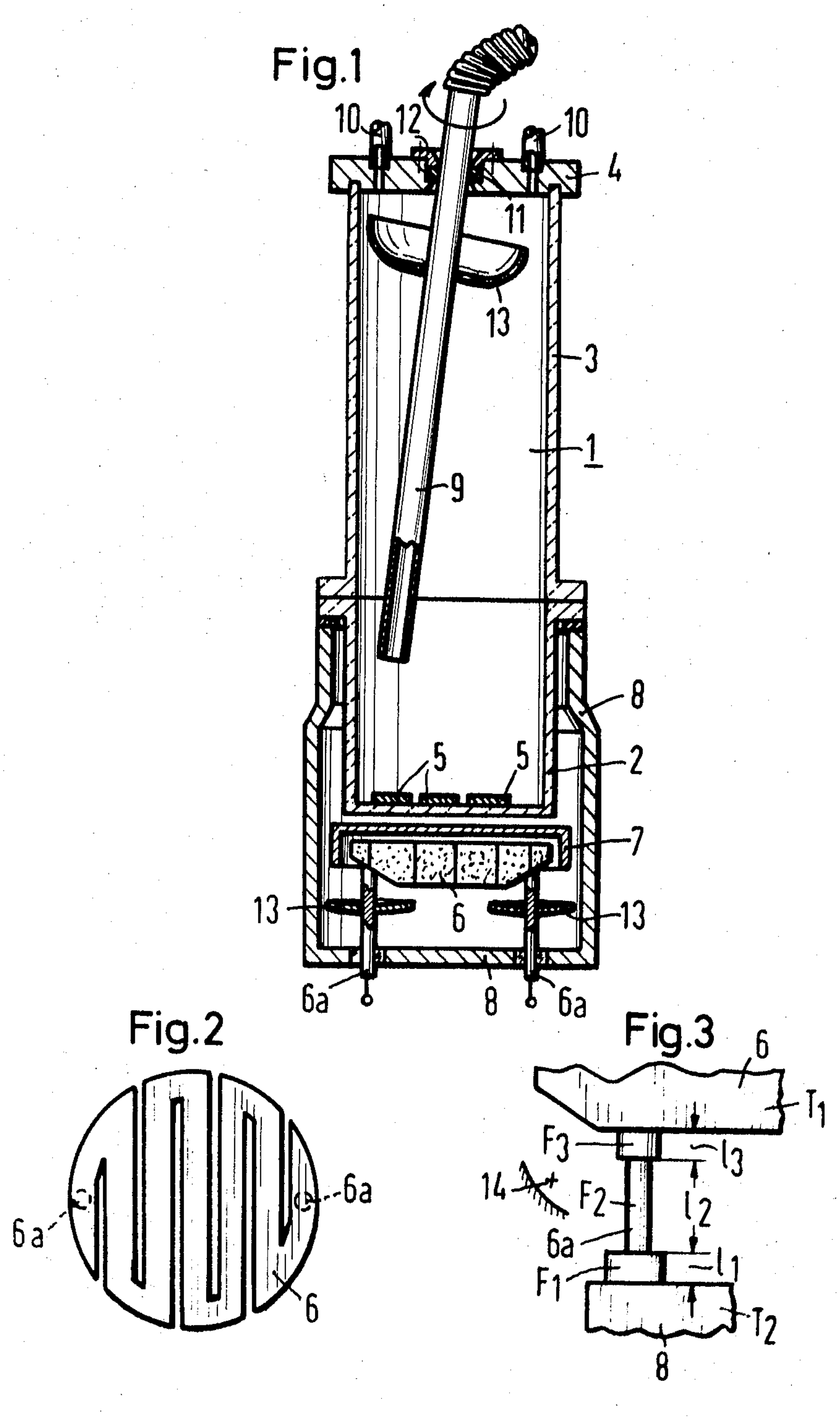
FIG. 2 shows a heater of meander shape.
FIG. 3 shows a partial, enlarged section of FIG. 1.

While the device serves primarily for epitactic coating of the semiconductor discs, it can, however, also be used, for example, for doping semiconductor discs from a gaseous phase.

In FIG. 1 the cylindrical reaction chamber 1 is formed by a pot or cup shaped lower portion 2 and a cylindrical upper portion 3, both preferably consisting of quartz. All portions of the treatment vessel, which are strongly heated during the operational process, and particularly the bottom of the reaction vessel, should consist of the most absorption-free $SiO_2$ possible, within the spectral region of 2.6 to 2.8$\mu$. The top of the reaction chamber 1 is sealed by a cover 4, for example of stainless steel. The discs 5, to be coated, and particularly comprised of monocrystalline semiconductor material, e.g. silicon, are arranged at the planar bottom of the cup shaped lower portion 2. The discs are heated from below, whereby the required heat is supplied by a heater 6, traversed by a current. The lower portion 2 of the reaction chamber 1, as well as the heating device 6, are preferably located in a cooled heating pot 8, consisting of metal. The supply of fresh reaction gas or other treatment gas, as well as the removal of the exhaust gas, is preferably effected upward. For this purpose, a gas supply inlet pipe 9 is provided centrally through the metal cover 4. Positioned concentrically to the gas inlet are a number of gas escape openings 10. In the example, the gas supply pipe is movably positioned in the cover 4. At the same time, a hermetic connection, between the pipe 9 and the cover 4, is ensured. This end is served by a seal 11, comprised of elastic material, chemically and thermally resistant, which annularly encloses the pipe 9. For example, the seal 11 is pressed by a pressure ring 12, against an abutment in the cover 4, as well as against the supply pipe 9. The inlet pipe may be moved in the direction of the arrow from without the reaction vessel, to produce a movement of the pipe in the sense of application Ser. No. 523,233 of A. Walther, now Pat. No. 3,472,684. In the interior of the reaction chamber, the gas supply pipe 9 is surrounded by a upward turned cup shaped protective sleeve 13 and rigidly connected thereto. This sleeve serves as radiation shield and protects cover 4 from overheating. Furthermore, cup 13 catches the particles which are likely to form at the cooler cover 4 and which might act as impurity seeds, when the device is used for epitactic method. Finally, in the interest of the purity of the reaction gas, it is expedient that the gas supply pipe 9 extend, at all times, into the lower portion 2, as for instance in case the lower portion 2 and the upper portion 3 of the reaction vessel became separated from each other.

Between heating member 6 and the bottom 2 of the reaction vessel of uniform thickness, carrying the discs to be coated, is the temperature adjusting device plate. This is preferably constructed in accordance with U.S. application Ser. No. 718,881 based on German application Ser. No. S 109,236 or in accordance with U.S. application Ser. No. 718,879 based upon German application Ser. No. S 109,235, and may be developed as a protective device for the quartz bottom of the reaction vessel 2 and, to this end, may be elastically mounted. If the cross-section of the reaction vessel 2 is a circle, the horizontal cross sections of the temperature adjusting plate 7 and of the heating device 6, are also circular with respect to their outer periphery, provided that the understructure is ignored, created by the cooling of a stetched conductor.

The present invention relates to the specific heating device 6, and to the current supply contacts 6*a*, which contact said heating device 6. The heater preferably consists of a heat resistant conductor, such as carbon, graphite, molybdenum, tantalum, or the like, which has a uniform, preferably rectangular or round cross section and which is preferably wound in a single plane parallel, spiral or preferably meander shape, to the extension of the semiconductor discs 5, to be heated. The turns are so dense that the best possible homogenous temperature distribution results above the heater 6. For the same reason, the individual turns of the heater are preferably and expediently insulated against each other by a thin air gap, in order to obtain the most equal current density over the entire surface of the heater. The windings or coils of the heater are preferably reduced somewhat toward the periphery of the heater in order to allow the temperature at the edge to proceed as flatly as possible, in the region above the heater. The coils of the heater 6 are cut off at their surface, at a plane running parallel to the discs 5, as well as to the bottom of the treatment chamber. The temperature plate 7 is also parallel to this plane. Such a heating device is illustrated, for example, in German Pat. No. 1,216,851 and proceeds in a meander shape, which is shown in the horizontal cross section in FIG. 2. This FIG. 2 also shows the localities of the terminal electrodes 6*a*. Radiation shields 13 (FIG. 1) are provided to redirect a portion of the downwardly radiated heat back to the heating device, in the vicinity of the connecting points for the current supply electrodes 6*a*, via said supply electrodes, by means of radiation and conductance. The following considerations apply for the electric leads:

FIG. 3 illustrates the dimensions of a current lead 6*a*, which carries the heating device 6. As is seen by this figure, this current lead may be comprised of portions with variable cross sections, for the current flow. If the current supply lead consists, for example, of parts having cross sections $F_1$, $F_2$, $F_3$ and the accompanying lengths $l_1$, $l_2$ and $l_3$ and if $T_1$ is the temperature of the heater 6 and $T_2$ the temperature at the other end of the electrode supply, then for current J we have equation:

$$\frac{J^2\cdot\rho}{\lambda(T_1-T_2)}=\frac{\left[\frac{F_1}{l_1}+\frac{F_2}{l_2}+\frac{F_3}{l_3}\right]}{\left[\frac{l_1}{F_1}+\frac{l_2}{F_2}+\frac{l_3}{F_3}\right]}$$

It is assumed thereby that the cross section of the current leads is larger at the ends $F_1$ and $F_3$ than in the center $F_2$. In the formula $\rho$ is the specific resistance of the electric leads 6*a*, comprised of homogenous material, and $\lambda$ is the specific conductance of said material. If, as in the case of the example, $F_1=F_3$, it follows:

$$J^2\cdot\rho:\lambda(T_1-T_2)=F_1\cdot F_2:l_1\cdot l_2$$

or if $F_1=F_2=F_3$, then:

$$J^2\cdot\rho:\lambda(T_1-T_2)=F^2:l^2$$

Finally, heating devices, for example heating coils 14, may be placed near the locations of the contact terminals, beneath heating device 6, and neutralize the heating losses by a removal along the electrodes. In this case also, it is recommended to operate the heating device with an inert gas, in order to prevent oxidation of the heater and of the heating coil 14.

It is also favorable if a portion of the heat energy, radiated downwardly by the heater, is caught on radiation paths 13, which are affixed to the current leads and which have absorbing properties and good heat conductance. This heat energy is then supplied to the current supply electrodes, by means of heat conductance, in order to heat the latter as much as possible in relation to the heater temperature. The heat flow from heater 6 into the current leads 6*a* is thus reduced.

We claim:

1. In a device for thermal processing of disc shaped objects for semiconductor purposes, wherein the discs to be treated are arranged on the bottom of a treatment chamber and are heated from below to appropriate processing temperature by an electric heating device, with an areal extension with its upper surface parallel to the discs being treated, a heating pot enclosing said electric heating device and lower portion of said treatment chamber and structurally connects said electric heating device to said treatment chamber, the improvement which comprises holding the electric heating device by its current-supply electrodes only and providing at least one radiation shield beneath the heating device to reflect a portion of the heat energy that is radiated downwardly by the heating device, back to said heating device, in only the vicinity of the connecting point to reduce or compensate the heat losses caused by dissipation, via said current electrodes.

2. The device of claim 1, wherein a portion of the heat energy trapped by the radiation shield is redirected to the heater, by means of heat conduction, via the current lead electrodes.

3. In a device for thermal processing of disc shaped objects for semiconductor purposes, wherein the discs to be treated are arranged on the bottom of a treatment chamber and are heated from below to appropriate processing temperature by an electric heating device, with an areal extension with its upper surface parallel to the discs being treated, a heating pot enclosing said electric heating device and lower portion of said treatment chamber and structurally connects said electric heating device to said treatment chamber, the improvement which comprises holding the electric heating device by its current-supply electrodes only and providing at least one auxiliary heating device to compensate for the heat losses of the heating element caused by dissipation via the current-supply electrodes.

4. A device for thermal processing of disc shaped objects for semiconductors, whereby the discs to be processed are arranged at the bottom of a treatment chamber and are heated to processing temperature by an electric heating device, situated beneath said bottom, which is expanded with respect to area and extends with its surface in parallel to the discs under treatment, a heating pot enclosing said electric heating device and lower portion of said treatment chamber and structurally connects said electric heating device to said treatment chamber, said heating device is held only by its current-supply electrodes and is provided with additional means which effect a reduction of the temperature differences between the extension-points of said electrodes at the heater body, and the remaining places of the heater.

References Cited

UNITED STATES PATENTS

| | | | |
|---|---|---|---|
| 2,691,717 | 10/1954 | Huck | 219—462 |
| 2,933,586 | 4/1960 | Schusterius | 219—530 X |
| 3,151,006 | 9/1964 | Grabmaier et al. | 148—174 |
| 3,381,114 | 4/1968 | Nakanuma | 118—49.5 X |
| 606,792 | 7/1898 | Quidas | 219—347 X |
| 1,514,228 | 11/1924 | Price | 219—347 X |
| 1,547,647 | 7/1925 | Furfaro et al. | 219—349 |

OTHER REFERENCES

Journal of Applied Physics, "Crystal Growth of GaAs from Ga by a Traveling Solvent Method" by Mlavsky et al., vol. 34, No. 9, September 1963, pp. 2885–2892.

VOLODYMYR Y. MAYEWSKY, Primary Examiner

U.S. Cl. X.R.

13—25; 165—185; 219—347, 405, 461, 462, 540